United States Patent
Byers et al.

(12)

(10) Patent No.: US 6,646,890 B1
(45) Date of Patent: Nov. 11, 2003

(54) MOUNTING OF MEZZANINE CIRCUIT BOARDS TO A BASE BOARD

(75) Inventors: Charles Calvin Byers, Wheaton, IL (US); Todd Keaffaber, Plano, IL (US); Andrew F. Scott, North Aurora, IL (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/234,813

(22) Filed: Sep. 4, 2002

(51) Int. Cl.[7] .................................................. H05K 7/18

(52) U.S. Cl. ..................... 361/802; 361/758; 361/770; 211/41.17; 439/76.1; 439/79

(58) Field of Search ................................. 361/802, 770, 361/792, 825, 719, 727, 742, 748, 758, 756, 683, 804; 211/41.17; 439/76.1, 79

(56) References Cited

U.S. PATENT DOCUMENTS

| 4,669,616 A | * | 6/1987 | Mazura | 211/41.17 |
| 5,031,074 A | * | 7/1991 | Ravid | 361/683 |
| 5,186,377 A | * | 2/1993 | Rawson et al. | 228/37 |
| 6,166,917 A | * | 12/2000 | Anderson | 361/756 |

* cited by examiner

*Primary Examiner*—Randy Gibson
*Assistant Examiner*—Hung Bui

(57) ABSTRACT

Mezzanine boards can be added to and removed from a supporting base board mounted in a slot of a shelf adjacent other base boards while the base boards remain in electrical service. Guide rails allow a mezzanine board to be slid into position from the front edge of the base board. The guide rails themselves can be moved to provide a new spacing to accommodate a different width mezzanine board without having to take the supporting base board out of service. Openings in the sides of the guide rails promote the flow of air between the mezzanine board and the base board to provide cooling.

17 Claims, 3 Drawing Sheets

MOUNTING OF MEZZANINE CIRCUIT BOARDS TO A BASE BOARD

BACKGROUND OF THE INVENTION

This invention relates to printed circuit board assemblies in which a base board supports at least one additional circuit board, referred to as a mezzanine board or a daughter board. More specifically, the invention relates to the way the mezzanine board is mounted to the base board, and the ability to insert or remove mezzanine boards while the supporting base board and adjacently mounted base boards and mezzanine boards remain in service.

The general use of daughter boards supported by a base board is well established. For example, the motherboard of a personal computer typically accepts a plurality of daughter boards that plug into sockets on the motherboard so that the daughter boards are mounted perpendicular to the motherboard. This arrangement promotes configurability and flexibility since different daughter boards that provide different functions can be selected for use with a motherboard.

Mezzanine boards have also been used to provide similar configurability. As used herein, a "mezzanine board" refers to a circuit board that is mounted co-planar to its associated base board. In known arrangements rigid, cylindrical standoffs mount the mezzanine board to the base board. Typically, screws are used to secure the mezzanine board to the standoffs.

While this mounting arrangement of mezzanine boards provides configurability, such mezzanine boards cannot be hot-swapped, that is, the mounting arrangement prevents the removal or installation of a mezzanine board while its supporting base board remains installed and in active electrical operation. This problem is exacerbated where a plurality of base boards are mounted in adjacent slots in a shelf, such as designed for mounting in a rack. The presence of another adjacent base board in close proximity to the mezzanine board prevents access to the screws located at the standoff locations on the mezzanine board. Thus, to remove or install a mezzanine board on a shelf-mounted base board, the base board has to be taken out of electrical service and removed from its slot in the shelf. This is generally undesirable and is especially disadvantageous in equipment, such as in telecommunication networks, where continuous service must be provided.

SUMMARY OF THE INVENTION

The above problem is solved and an advance made in the art in accordance with the present invention that accommodates the insertion or removal of a mezzanine board while the supporting base board remains in service. As used herein, a board being "in service" means that it is in its normally installed position and is operating to provide intended functions.

It is an object of the present invention to provide an improved mounting technique by which mezzanine boards can be inserted or removed from the supporting base board while the base board remains in active electrical service. The mounting technique also supports this functionality even while the supporting base board is mounted in a shelf with other base boards in adjacent slots. It is a further object of the invention to accommodate different widths of mezzanine boards.

In accordance with an embodiment of the present invention, an assembly of circuit boards includes a base board and a faceplate mounted along the edge of the base board. Spaced apart mounts are attached to the base board. Guide rails are attached to the base board by the mounts and extend away from the plane of the base board. The guide rails include at least one longitudinal channel. The channels on two guide rails engage opposing edges of a mezzanine board and permit the mezzanine board to be slid into position and supported. The faceplate includes an aperture dimensioned to accept the mezzanine board so that the mezzanine board can be installed or removed while the base board remains in active electrical service.

DETAILED DESCRIPTION OF EMBODIMENTS

Figure 1:
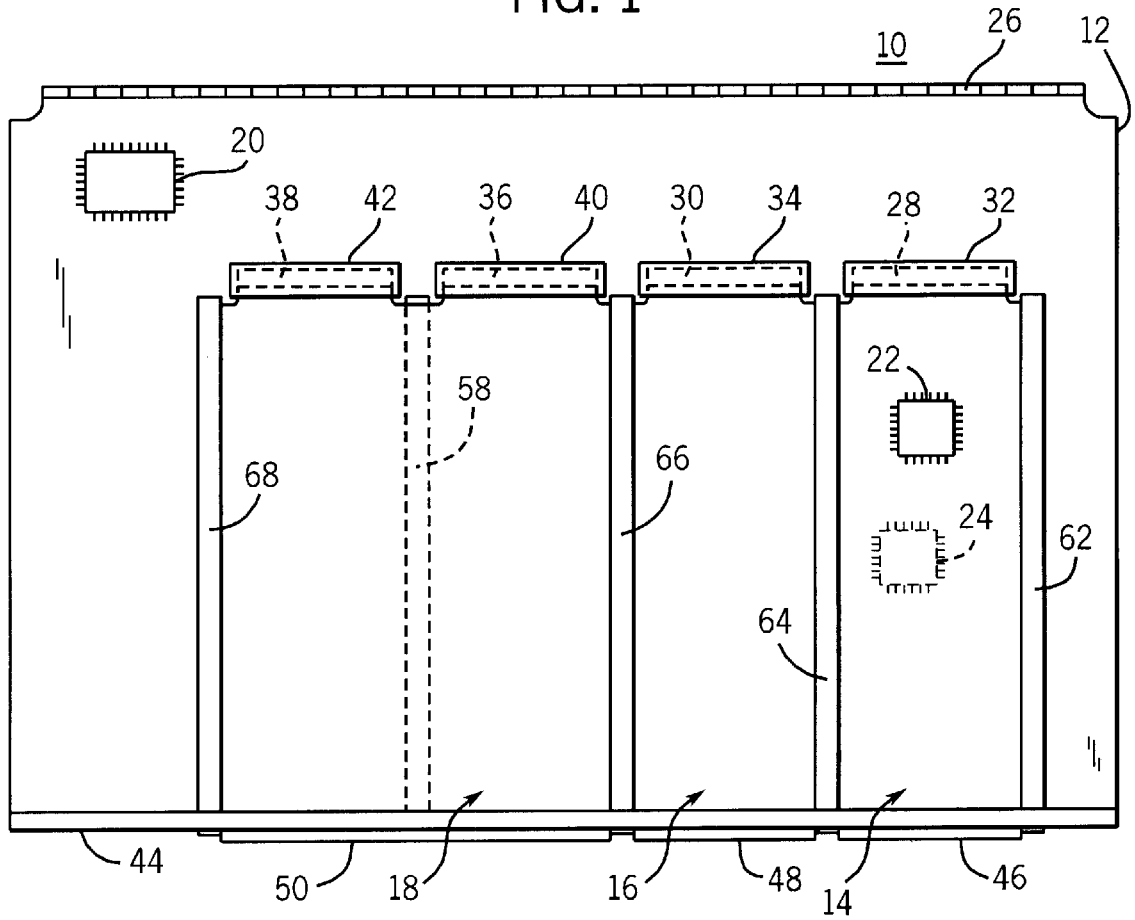
FIG. 1 is a top view of a circuit board assembly that incorporates an embodiment of the present invention.

Referring to FIG. 1, a circuit board assembly 10 incorporates an embodiment of the present invention. A base board 12 supports mezzanine boards 14 and 16, and supports a doublewide mezzanine board 18. The base board and mezzanine boards support a plurality of electrical components such as exemplary integrated circuits 20, 22 and 24. Base board 12 includes a rear edge connector portion 26 with metallic pins suited for establishing electrical connections between the base board and a socket or backplane (not shown). Alternatively the rear edge connector could support optical interconnections. Similarly, mezzanine boards 14 and 16 include rear edge connector portions 28 and 30, respectively, with metallic pins that established electrical connections through sockets 32 and 34. The double width mezzanine board 18 contains two rear edge connector portions 36 and 38 that established electrical connections by sockets 40 and 42, respectively. A faceplate 44 is preferably coupled to the front edge of base board 12 and is preferably dimensioned to form a substantially air-tight and radio frequency seal (see FIG. 7) within slot 150(a) of a shelf 52 when the circuit board assembly 10 is installed in the slot. The faceplate 44 includes an aperture dimensioned to accept mezzanine boards 14, 16 and 18. Faceplates 46, 48 and 50 associated with mezzanine boards 14, 16 and 18, respectively, cover and seal the aperture in faceplate 44 when the corresponding mezzanine boards are installed.

Figure 2:
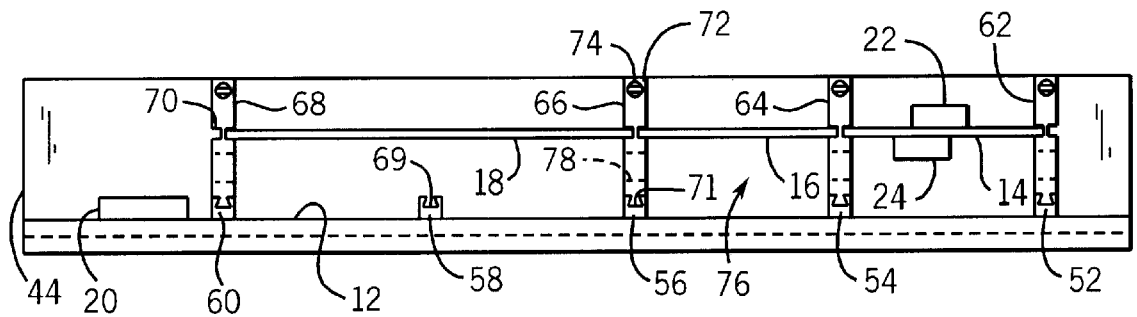
FIG. 2 is a front view of the circuit board assembly as shown FIG. 1 with faceplates not shown for clarity.

Referring to FIGS. 1 and 2, a series of longitudinal mounts 52, 54, 56, 58, and 60 are attached to base board 12. Mounts 52, 54, 56, and 60 receive and attach guide rails 62, 64, 66 and 68, respectively, to base board 12. It will be noted that mount 58 does not support a corresponding guide rail because of double-wide mezzanine board 18. As best seen in FIG. 2, the exemplary mounts each contain a channel 69 having a dovetail cross-section. The bottoms of the guide rails contain a projection 71 having a dovetail cross-section complementary to the dovetail cross-section of the mounts permitting the guide rails to be slid into the channels in the mounts and captivated by the dovetail engagement. FIG. 2 is shown without the faceplates 46, 48 and 50 associated with the mezzanine boards in order to better illustrate the mounting assembly.

Each of the guide rails includes at least one longitudinal channel 70, and preferably includes opposing longitudinal channels on each side of the guide rail to support the lateral edges of two mezzanine boards. Since guide rails 62 and 68 represent the beginning and ending guide rails in the series of guide rails, it will be apparent that each need only contain a single longitudinal channel along the inside of each guide rail. The channels 70 in guide rails 62 and 64 support mezzanine board 14 along its lateral edges. The channels 70 in guide rails 64 and 66 support mezzanine board 16 along its lateral edges. Similarly, the channels 70 in guide rails 66 and 68 support the double width mezzanine board 18 along its lateral edges.

The guide rails each preferably include a means for locking the guide rail against forward or rearward movement after the guide rails are installed in the mounts. In the illustrative embodiment, each guide rail preferably includes a projecting tab portion 72 having a hole or recess dimensioned to receive a screw 74 that locks the tab of the guide rail to the faceplate 44 by a threaded hole in the faceplate.

In order to provide a universal acceptance of mezzanine boards of different widths, it is desirable to provide spaced apart mounts attached to the base board 12 wherein the spacing between consecutive mounts is equal. If the spacing between mounts is distance F, mezzanine boards having a width of X times F plus S can be accommodated, where X a positive integer> and less than the number of mounts traversed, and S is the total width of mountings traversed. This arrangement also permits mezzanine boards of different widths to be accommodated by the same base board such as shown in the exemplary example in which mezzanine boards 14 and 16 have the same width F, and mezzanine board 18 has a width of 2 times F. Advantageously, by using equal spacing between mounts and equal width sockets (32, 34, 40, 42) a base board 12 can be configured to receive different mezzanine boards even after the base board has been originally installed. For example, double width mezzanine board 18 could be removed, and an additional guide rail installed in mount 58, thereby permitting two mezzanine boards of a width F to be installed in place of the 2 times F mezzanine board. Advantageously this change does not require base boards or unaffected mezzanines boards to be powered off.

A chamber 76 is defined by guide rails 64 and 66, mezzanine board 16, the area of base board 12 adjacent mezzanine board 16, and faceplate 48. Also, the rear of chamber 76 will likely be at least partially blocked by socket 34 that is supported by base plate 12. Because of heat dissipated by the electrical components in or near chamber 76, a means is needed to provide cooling for such heat. In the illustrative embodiment, transverse holes 78 through guide rails 64 and 66 provide a path through which forced air can be circulated to provide cooling. Since similar chambers are defined associated with each mezzanine board, each of the guide rails preferably includes holes or openings in order to accommodate forced air circulation.

Figure 3:
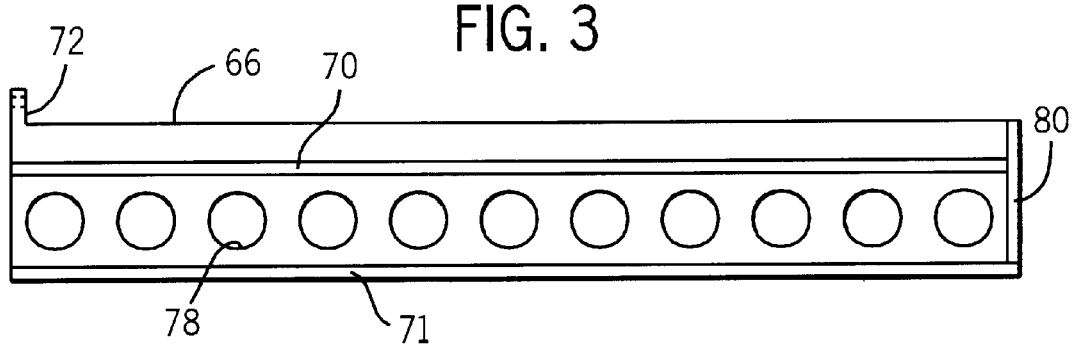
FIG. 3 is a side view of an exemplary guide rail in accordance with the present invention.

FIG. 3 shows a side view of exemplary side rail 66. As explained above, a hole through tab portion 72 receives a screw that locks the guide rail to the faceplate of the base board. The shown longitudinal channel 70 engages a lateral edge of mezzanine board 16. Another longitudinal channel (not shown) that is opposite the shown channel 70 engages the lateral edge of mezzanine board 18. Transverse holes 78 provide for air circulation and cooling of the enclosed chambers. The bottom of the guide rail of defines a dovetail 71 that mates with the dovetail 69 defined in the sliding mount 56. A rear wall 80 provides a stop for the mezzanine boards to prevent further rearward travel of the mezzanine boards as they are slid rearward into the guide rails.

Figure 4:
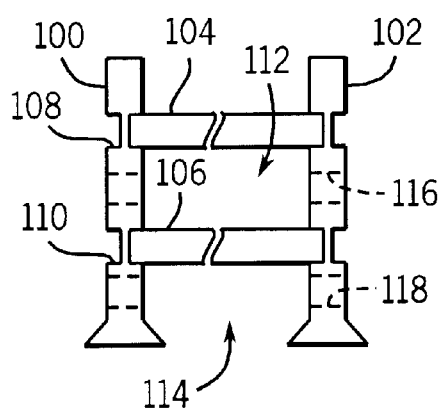
FIG. 4 is a partial view of an alternative embodiment of guide rails in accordance with the present invention.

FIG. 4 illustrates an alternative embodiment in which guide rails 100 and 102 accommodate a plurality of nested mezzanine boards 104 and 106 disposed above a base board. In this embodiment each guide rail includes a longitudinal pair of channels 108 and 110 disposed to accept the lateral ages of the nested mezzanine boards 104 and 106. In order to provide cooling for chambers 112 and 114, transverse holes 116 and 118 are provided. This embodiment illustrates that a pair of the guide rails can support more than one mezzanine board.

Figure 5:
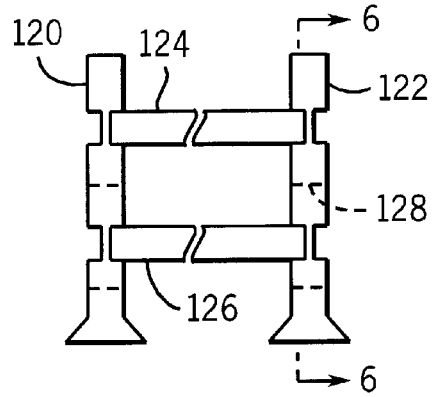
FIG. 5 is a partial view of a still further embodiment of guide rails in accordance with the present invention.
Figure 6:
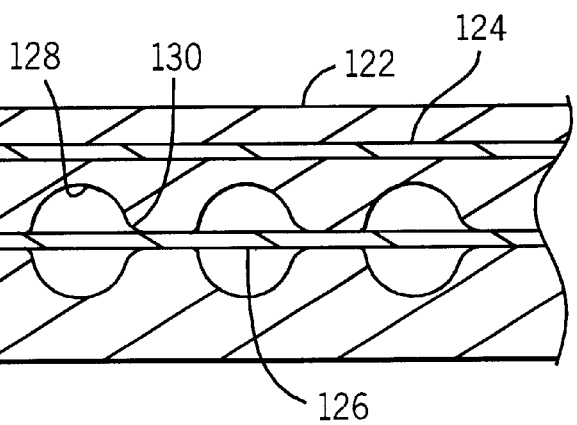
FIG. 6 is a partial cross-sectional view taken along line 6—6 of FIG. 5.

FIGS. 5 and 6 illustrate still another embodiment in which guide rails 120 and 122 accommodate a plurality of nested mezzanine boards 124 and 126 disposed above a base board. In order to provide cooling for the chamber defined between mezzanine boards 124 and 126, and chamber defined between mezzanine board 126 and the below base board, holes 128 are provided in the guide rails. The holes 128, as best seen in FIG. 6, periodically traverse guide rail 122 about the channel that supports the lateral edge of mezzanine board 126. Thus, each hole provides for air flow above and below mezzanine board 126. Preferably, the rearward portion 130 of each hole 128 is flared towards the front to guide the leading edge of board 126 back into the channel after traversing each hole.

Figure 7:
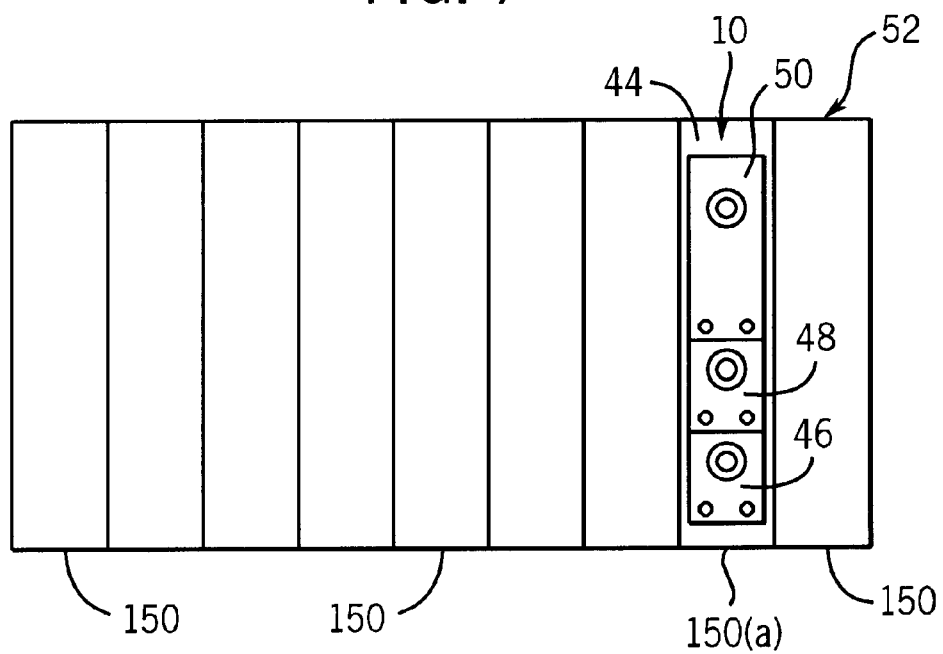
FIG. 7 is a front elevational view of a shelf that holds a plurality of circuit board assemblies in accordance with the present invention.

FIG. 7 illustrates a shelf 52 having a plurality of slots 150 configured to accept circuit board assemblies consisting of base boards and base boards with mezzanine boards. A backplane (not shown) is disposed to engage the rear edge of each base board and establish electrical connections between the base board and other circuitry. A circuit board assembly 10 is shown disposed in slot 150(a). Mezzanine board faceplates 50, 48 and 46 provide a seal for the aperture in base board faceplate 44. The mezzanine boards faceplates may be secured to the base board faceplate 44 by a variety of known techniques. Various connectors and visual indicators may be associated with each faceplate depending on the functions provided by the respective mezzanine board. FIG. 7 illustrates the relative position of circuit board assembly 10 relative to base boards mounted to adjacent slots in shelf 52. Being able to insert or remove mezzanine boards supported by the guide rails provides an advantage in that base board 12 can remain in electrical service in its slot while a mezzanine board is inserted or removed. This provides an important aspect of the present invention in that functions provided by the base board that supports the mezzanine board to be inserted or removed, as well as functions provided by adjacent base boards continue in operation during the insertion or removal of the mezzanine board. It should also be noted that a base board can be reconfigured by adding for removing guide rails to accept a different width of mezzanine board, also while keeping the base board in service. This enhances configurability and makes it possible to make changes in the field to operating equipment without having to take a corresponding base board out of service.

Although embodiments on the present invention have been described and shown in the accompanying figures, it will be apparent to those skilled of the art that various changes and modifications can be made to the embodiments while remaining within the scope of the present invention. For example, the faceplate associated with the base board could be mounted to the edge of the base board, or could be mounted in the opening of a slot in a shelf associated with the base board. Likewise, the faceplates associated with the mezzanine boards could be mounted to the edge of the respective mezzanine boards, or could be independent faceplates that amount to the faceplate of the base board, or directly to the slot in a shelf. Although the dovetail cross-section provides a convenient coupling between the guide rails and mounts, it will be apparent to those skilled of the art that other shapes and configurations could be utilized to hold the guide rails to the base board. Also, the mounts could contain a projection that mates with corresponding channel on the guide rails, as opposed to the reverse shown in the embodiments. Various means could be utilized to lock the guide rail in position so as to prevent lateral movement of the guide rail once installed. Holes of a different cross-section shape or openings defined by the guide rails can be used to promote air circulation for cooling within the chambers. Although the board assembly has been described in terms of electrical circuitry, other components, such as optical devices and cables, could also benefit from the advantages described herein. If it is known that a mezzanine board of double width or greater will be installed in an area of the base board, the unused mount(s) that will not receive a guide rail need not be installed unless future compatibility is desired to be maintained. The claims that follow define the scope of the present invention.

What is claimed is:

1. An assembly of circuit boards comprising:
   a base board;
   a faceplate disposed substantially perpendicular to the plane of the base board and mounted along one edge of the base board;
   spaced apart mounts attached to the base board;
   guide rails extending away from the plane of the base board and attached to the base board by the mounts, the guide rails including at least one longitudinal channel;
   at least one mezzanine board having opposing longitudinal edges;
   first and second channels in first and second guide rails are dimensioned to receive first and second longitudinal edges of the mezzanine board, respectively;
   the faceplate having at least one aperture dimensioned to accept the at least one mezzanine board and provide access to the first and second guide rails so that the first and second longitudinal edges of the at least one mezzanine board can be slid into the respective first and second channels.

2. The assembly according to claim 1 wherein the at least one mezzanine board includes a rear edge with electrical connection means and the base board includes a socket for receiving the electrical connection means thereby establishing electrical connections between the mezzanine board and the base board.

3. The assembly according to claim 1 wherein at least some of the guide rails have opposing channels for supporting a first mezzanine board on one side of the guide rail and another mezzanine board on the other side of the guide rail.

4. The assembly according to claim 1 wherein the mounts are spaced apart from each other by a distance of F to accommodate mezzanine boards of a width of X times F plus S, where X is a positive integer greater than zero and less than the number of mounts, and S is the total width of mountings traversed.

5. The assembly according to claim 1 wherein the guide rails include a means for preventing lateral movement relative to the respective mounts.

6. The assembly according to claim 1 wherein the at least one mezzanine board includes a faceplate dimensioned to substantially cover of the respective aperture in the faceplate of the base board.

7. The assembly according to claim 1 wherein the guide rails have a series of transverse openings disposed to promote the passage of air between the base board and the at least one mezzanine board.

8. The assembly according to claim 1 wherein each guide rail contains at least two spaced apart channels on the same side surface to accommodate a corresponding number of mezzanine boards to be stacked in parallel relationship above the base board.

9. The assembly according to claim 8 wherein the guide rails have a series of transverse openings disposed to promote the passage of air between the base board and the closest mezzanine board, and between adjacent mezzanine boards.

10. The assembly according to claim 9 wherein the transverse openings intersect with at least one channel on the guide rail to define forward and rearward intersections with the channel, the rearward intersections having an outward flair to assist in guiding the leading edge of a mezzanine board into the channel rearward of the opening.

11. The assembly according to claim 1 further comprising a shelf with a plurality of slots dimensioned to accept base boards mounted parallel to each other, the mounting of the at least one mezzanine board to its supporting base board permitting the removal of the one mezzanine board from the base board supporting it while the supporting base board and adjacent other base boards remain in service.

12. The assembly according to claim 1 further comprising a second mezzanine board mounted adjacent to and in the same plane as the at least one mezzanine board, the second mezzanine board supported along one of its edges by the guide rail that also supports the at least one mezzanine board.

13. The assembly of claim 1 wherein said spaced apart mounts are elongated and each mount is dimensioned to be substantially contiguous with a corresponding supported guide rail.

14. An assembly of circuit boards comprising:
   a base board;
   a faceplate disposed substantially perpendicular to the plane of the base board and mounted along one edge of the base board;
   spaced apart mounts attached to the base board;
   guide rails extending away from the plane of the base board and attached to the base board by the mounts, the guide rails including at least one longitudinal channel;
   at least one mezzanine board having opposing longitudinal edges;
   first and second channels in first and second guide rails are dimensioned to receive first and second longitudinal edges of the mezzanine board, respectively;
   the faceplate having at least one aperture dimensioned to accept the at least one mezzanine board and provide access to the first and second guide rails so that the first and second longitudinal edges of the at least one mezzanine board can be slid into the respective first and second channels, wherein the mounts comprise longitudinal members that include one of a longitudinal extending channel and a longitudinally extending projection dimensioned to slide within the channel, and the guide rails include the other of a longitudinal extending channel and a longitudinally extending projection dimensioned to slide within the channel.

15. The assembly according to claim 14 wherein the channels and the projections are dimensioned to form a mating dovetail cross-section.

16. An assembly for supporting at least one mezzanine board having opposing longitudinal edges, the assembly comprising:

a base board;

spaced apart mounts attached to the base board;

first and second guide rails extending away from the plane of the base board and attached to the base board by the mounts, the first and second guide rails including at least one longitudinal channel;

first and second channels in said first and second guide rails are dimensioned to slidingly receive first and second longitudinal edges of the mezzanine board, respectively;

the mounts comprising longitudinal members that include one of a longitudinal extending channel and a longitudinally extending projection dimensioned to slide within the channel, and the guide rails include the other of a longitudinal extending channel and a longitudinally extending projection dimensioned to slide within the channel.

17. The assembly of claim 16 wherein said spaced apart mounts are elongated and each mount is dimensioned to be substantially contiguous with a corresponding supported guide rail.

* * * * *